United States Patent
Lin et al.

(10) Patent No.: US 8,395,053 B2
(45) Date of Patent: Mar. 12, 2013

(54) CIRCUIT SYSTEM WITH CIRCUIT ELEMENT AND REFERENCE PLANE

(75) Inventors: Yaojian Lin, Singpore (SG); Haijing Cao, Singapore (SG); Qing Zhang, Singapore (SG)

(73) Assignee: Stats Chippac Ltd., Singapore (SG)

( * ) Notice: Subject to any disclaimer, the term of this patent is extended or adjusted under 35 U.S.C. 154(b) by 689 days.

(21) Appl. No.: 11/769,296

(22) Filed: Jun. 27, 2007

(65) Prior Publication Data
US 2009/0004504 A1    Jan. 1, 2009

(51) Int. Cl.
*H05K 1/16* (2006.01)

(52) U.S. Cl. ........ 174/260; 174/250; 174/255; 361/760; 361/765; 361/766; 361/792; 361/793; 361/794; 361/795; 29/25.41; 438/238; 438/299; 438/570; 438/761; 257/36; 257/296; 257/536

(58) Field of Classification Search .......... 174/260, 174/250, 255; 361/792–795, 760, 765, 766; 29/25.41; 438/238, 299, 570, 761; 257/36, 257/296, 536
See application file for complete search history.

(56) References Cited

U.S. PATENT DOCUMENTS

| | | | | |
|---|---|---|---|---|
| 4,241,103 A * | 12/1980 | Ohkubo et al. | ............... | 427/103 |
| 4,259,564 A * | 3/1981 | Ohkubo et al. | ............... | 347/208 |
| 4,430,662 A * | 2/1984 | Jillie et al. | ............... | 257/36 |
| 5,552,910 A * | 9/1996 | Okano | ............... | 349/50 |
| 5,576,710 A * | 11/1996 | Broderick et al. | ............... | 342/1 |
| 5,777,328 A * | 7/1998 | Gooch | ............... | 250/338.4 |
| 5,777,329 A * | 7/1998 | Westphal et al. | ......... | 250/339.02 |
| 5,841,137 A * | 11/1998 | Whitney | ............... | 250/338.5 |
| 5,883,683 A * | 3/1999 | Yamaue et al. | ............... | 349/49 |
| 5,966,294 A * | 10/1999 | Harada et al. | ............... | 361/794 |
| 6,028,312 A * | 2/2000 | Wadsworth et al. | ............... | 250/351 |
| 6,110,772 A * | 8/2000 | Takada et al. | ............... | 438/238 |
| 6,127,722 A * | 10/2000 | Doi et al. | ............... | 257/536 |
| 6,128,199 A * | 10/2000 | Kambara | ............... | 361/760 |
| 6,172,666 B1 * | 1/2001 | Okura | ............... | 345/168 |
| 6,504,202 B1 | 1/2003 | Allman et al. | | |
| 6,515,324 B2 * | 2/2003 | Shibuya et al. | ............... | 257/296 |
| 6,580,111 B2 * | 6/2003 | Kim et al. | ............... | 257/301 |
| 6,599,807 B2 * | 7/2003 | Lim et al. | ............... | 438/396 |
| 6,846,752 B2 | 1/2005 | Chambers et al. | | |
| 6,897,106 B2 * | 5/2005 | Park et al. | ............... | 438/240 |
| 7,038,266 B2 | 5/2006 | Wang | | |
| 7,071,070 B2 | 7/2006 | Gau | | |
| 7,084,042 B2 | 8/2006 | Olewine et al. | | |
| 7,342,804 B2 * | 3/2008 | Langhorn et al. | ............... | 361/766 |
| 2002/0086446 A1 * | 7/2002 | Charpentier et al. | ............ | 438/3 |
| 2002/0182374 A1 * | 12/2002 | Tung | ............... | 428/182 |
| 2003/0003699 A1 * | 1/2003 | Matsuzaki et al. | ............... | 438/570 |
| 2004/0079980 A1 * | 4/2004 | Hieda | ............... | 257/303 |
| 2004/0130877 A1 * | 7/2004 | Okubora | ............... | 361/793 |
| 2004/0169216 A1 * | 9/2004 | Kiyotoshi | ............... | 257/296 |
| 2004/0169255 A1 * | 9/2004 | Kiyotoshi | ............... | 257/532 |
| 2004/0248359 A1 * | 12/2004 | Hieda | ............... | 438/239 |
| 2005/0093096 A1 * | 5/2005 | Honjo et al. | ............... | 257/567 |
| 2005/0156221 A1 * | 7/2005 | Kiyotoshi | ............... | 257/306 |
| 2005/0212082 A1 * | 9/2005 | Takeda et al. | ............... | 257/534 |
| 2006/0132462 A1 * | 6/2006 | Geaghan | ............... | 345/173 |
| 2006/0185140 A1 * | 8/2006 | Andresakis et al. | ......... | 29/25.41 |

* cited by examiner

*Primary Examiner* — Xiaoliang Chen

(74) *Attorney, Agent, or Firm* — Ishimaru & Associates LLP; Mikio Ishimaru

(57) ABSTRACT

A circuit system comprising: forming a lower electrode over a substrate; forming a resistive film over the lower electrode; forming a multi-layered insulating stack over a portion of the resistive film; and forming an upper electrode over a portion of the multi-layered insulating stack.

20 Claims, 3 Drawing Sheets

CIRCUIT SYSTEM WITH CIRCUIT ELEMENT AND REFERENCE PLANE

TECHNICAL FIELD

The present invention relates generally to a circuit system and more particularly to a circuit system with a circuit element and a reference plane.

BACKGROUND ART

Modern consumer electronics, such as smart phones, personal digital assistants, and location based services devices, as well as enterprise electronics, such as servers and storage arrays, are packing more integrated circuits into an ever-shrinking physical space with expectations for decreasing cost. Every new generation of integrated circuits with increased operating frequency, performance and the higher level of large-scale integration have underscored the need for back-end integrated circuit manufacturing to provide more solutions involving the integrated circuit itself.

Numerous technologies have been developed to meet these requirements. Some of the research and development strategies focus on new package technologies while others focus on improving the existing and mature package technologies. Both approaches may include additional processing of the integrated circuits to better match the targeted package.

The continued emphasis in the integrated circuit technology is to create improved performance integrated circuit devices at competitive prices. This emphasis over the years has resulted in increasing miniaturization of integrated circuit devices, made possible by continued advances of integrated circuit processes and materials in combination with new and sophisticated device designs.

Numerous integrated circuit designs are aimed for mixed-signal designs by incorporating analog functions. One of the major challenges in the creation of analog processing circuitry (using digital processing procedures and equipment) is that a number of the components that are used for analog circuitry are large in size and are therefore not readily integrated into integrated circuits. The main components that offer a challenge in this respect are capacitors and inductors, since both these components are, for typical analog processing circuits, of considerable size. In response to the demands for improved package performance and analog circuitry integration, manufacturers may prepare to add passive devices on integrated circuit, packaging as well as printed-circuit boards to reduce overall system cost, boost overall system performance and enhance overall system reliability.

Although analog circuitry integration and processing support the miniaturization trend, other problems arise from this integration, particularly, the reliability of passive devices. For example, passive devices can pre-maturely breakdown below the operating voltage to reduce its useful lifetime.

Still thinner, smaller, and lighter package designs and integrated circuit designs and printed circuit designs have been adopted in response to continuing requirements for further miniaturization. At the same time, users are demanding the entire system, including integrated circuit, packages and printed circuit board that are more reliable under increasingly severe operating conditions.

Thus, a need still remains for a circuit system providing low cost manufacturing, improved yield, improved reliability, and greater flexibility to add passive devices on integrated circuits, packages and printed circuit boards. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

A circuit system comprising: forming a lower electrode over a substrate; forming a resistive film over the lower electrode; forming a multi-layered insulating stack over a portion of the resistive film; and forming an upper electrode over a portion of the multi-layered insulating stack.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
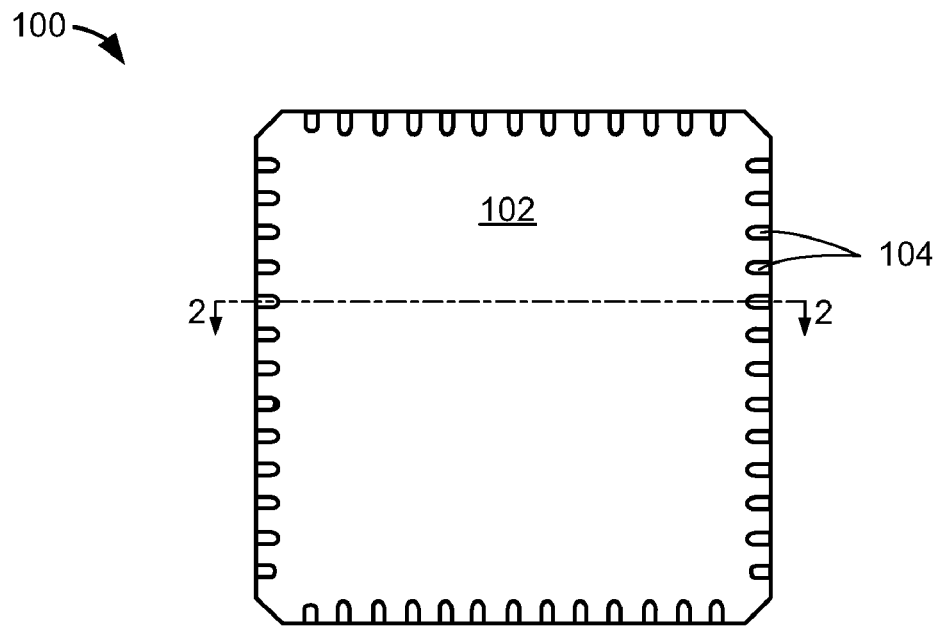
FIG. 1 is a bottom view of a circuit system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a bottom view of a circuit system 100 in a first embodiment of the present invention. The bottom view shows a package encapsulation 102, such as an epoxy molding compound, preferably surrounding and exposing a row of external interconnects 104, such as leads.

For illustrative purposes, the external interconnects 104 are shown in a single row configuration, although it is understood that the external interconnects 104 may be in a different configuration, such as multiple rows. Also for illustrative purposes, a package side of the circuit system 100 has the external interconnects 104 equally spaced, although it is understood that the circuit system 100 may have some sites depopulated such that the package side might not have the external interconnects 104 equally spaced.

Figure 2:
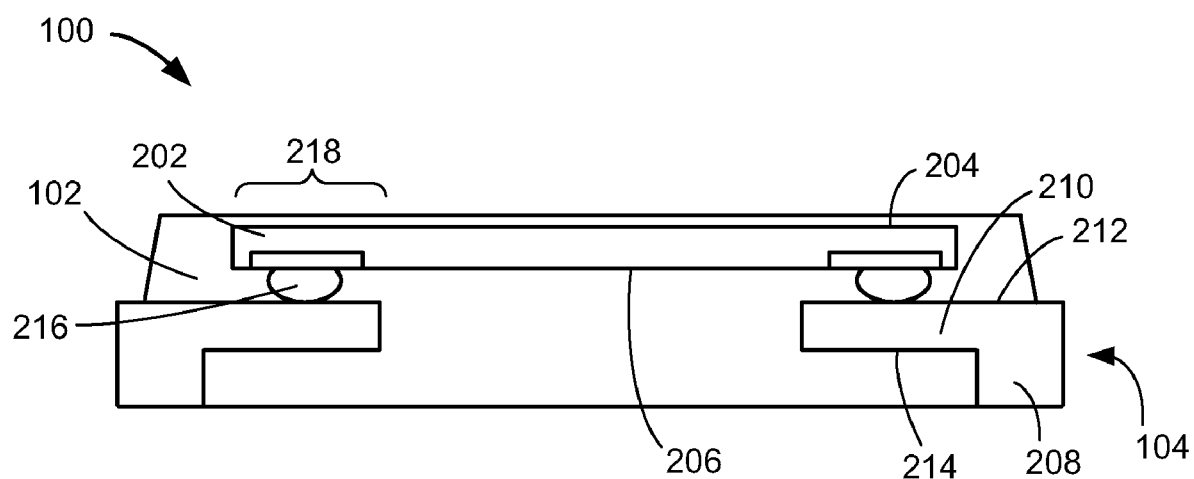
FIG. 2 is a cross-sectional view of the circuit system along line 2-2 of FIG. 1.

Referring now to FIG. 2, therein is shown a cross-sectional view of the circuit system 100 along a line 2-2 of FIG. 1. The cross-sectional view depicts a first circuit device structure 202 preferably mounted over the external interconnects 104. The first circuit device structure 202, such as an integrated circuit die, a printed circuit board, or a substrate, has a first non-electrical contact side 204, such as a non-active side, and a first electrical contact side 206, such as an active side, wherein the first electrical contact side 206 includes active circuitry and passive circuitry fabricated thereon. The first electrical contact side 206 is facing the external interconnects 104.

Each of the external interconnects 104 includes a body 208 and a tip 210, wherein the tip 210 has a first connect side 212 and a second connect side 214 on an opposing side to the first connect side 212. The first circuit device structure 202 is preferably mounted over the first connect side 212 with conductive balls 216, such as conductive balls or conductive bumps comprised of solder or gold, preferably electrically connecting a peripheral portion 218 of the first electrical contact side 206 of the first circuit device structure 202 to the first connect side 212.

The package encapsulation 102, such as an epoxy molding compound, covers the first circuit device structure 202 and the conductive balls 216. The package encapsulation 102 partially covers the external interconnects 104 exposing the body 208 of the external interconnects 104 and covering a portion of the tip 210 connected to the conductive balls 216.

Figure 3:
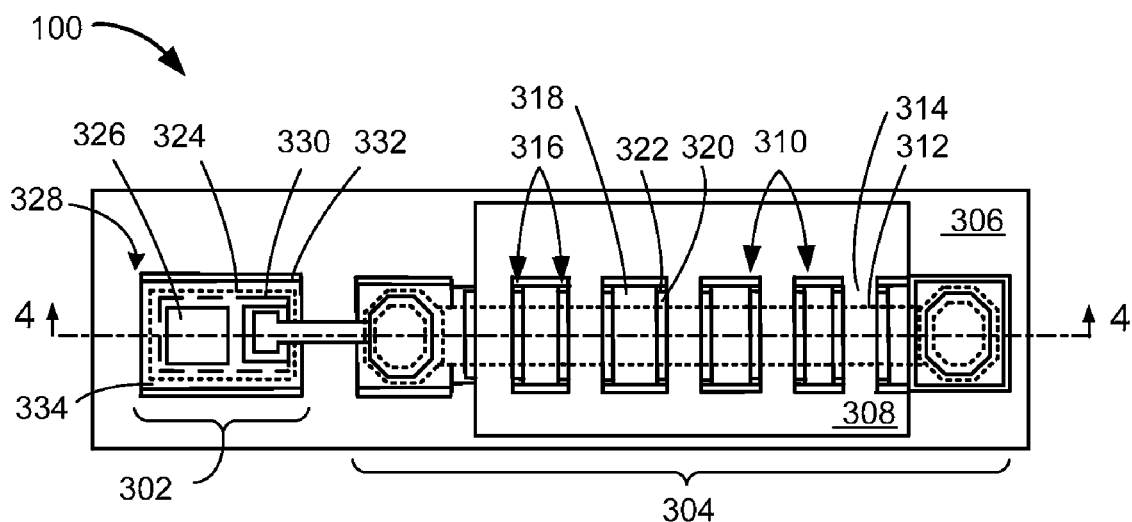
FIG. 3 is a schematic top view of a portion of the first electrical contact side of the circuit system.

Referring now to FIG. 3, therein is shown a schematic top view of a portion of the first electrical contact side 206 of FIG. 2 of the circuit system 100. The schematic top view depicts a first circuit element 302 and a second circuit element 304 over an insulating layer 306. The first circuit element 302 is shown as a capacitor, as an example. The second circuit element 304 is shown connected with a reference plane 308 having holes 310 of which a portion overlaps with a second lower electrode 312, as an example.

The reference plane 308 may preferably serve a number of functions. For example, the reference plane 308 may serve as a voltage reference plane, such as a ground plane. Another example, portions of the reference plane 308 between the holes 310 may serve as second upper electrode 314 for the second circuit element 304.

The second circuit element 304 preferably includes second multi-layered insulating stacks 316, as depicted by dotted lines, under the second upper electrode 314 and above a second resistive film 318. The "second" in the second multi-layered insulating stacks 316 as well as with other elements described with the second circuit element 304 is used as a matter of convenience to have a similar name to the second circuit element 304 and does not necessarily represent the "second" of elements of a same material or similar structure discussed for the circuit system 100.

The second multi-layered insulating stacks 316 include a second top dielectric film 320 and a second bottom dielectric film 322 below the second top dielectric film 320. The second bottom dielectric film 322 preferably reduces the stress to the second top dielectric film 320 and prevents cracking of the second top dielectric film 320.

The first circuit element 302 preferably includes a first lower electrode 324 and a first upper electrode 326 over the insulating layer 306. In between the first lower electrode 324 and the first upper electrode 326 is preferably a first multi-layered insulating stack 328 over a first resistive film 330. The first multi-layered insulating stack 328 completely isolates the first upper electrode 326 from the first resistive film 330. The first multi-layer insulating stack 328 completely covers the first resistive film 330 at an intersection of the first upper electrode 326 and the first resistive film 330. The intersection of the first upper electrode 326 and the first resistive film 330 is where the first upper electrode 326 overlaps with the first resistive film 330. The first upper electrode 326 is preferably over the first multi-layered insulating stack 328 and the first resistive film 330. The first lower electrode 324 is preferably under the first multi-layered insulating stack 328 and the first resistive film 330.

The first multi-layered insulating stack 328 includes preferably a first bottom dielectric film 332 and a first top dielectric film 334. The first bottom dielectric film 332 is preferably above the first resistive film 330 and below the first top dielectric film 334. The first bottom dielectric film 332 preferably reduces the stress to the first top dielectric film 334 and prevents cracking of the first top dielectric film 334.

The material of the first lower electrode 324 and the first upper electrode 326 can be from a number of conductive materials. For example, the first lower electrode 324 and the first upper electrode 326 may be formed from aluminum (Al), Al alloy, copper (Cu), gold (Au), or with other metals or metal alloys. For illustrative purposes, the first lower electrode 324 and the first upper electrode 326 are described potentially formed from substantially the same material, although it is understood that the first lower electrode 324 and the first upper electrode 326 may be formed with a different material or materials. Also for illustrative purposes, the first lower electrode 324 and the first upper electrode 326 are described potentially being formed with the same material, although it is understood that the first lower electrode 324 and the first upper electrode 326 may be formed with different layers for forming the circuit system 100.

The first bottom dielectric film 332 may be formed from a number of different materials. For example, the first bottom dielectric film 332 may be a dielectric material including silicon dioxide ($SiO_2$) or other dielectric materials. The thickness of the first bottom dielectric film 332 preferably is about in the range 50 Angstrom and 500 Angstrom, with a typical thickness of 100 Angstrom.

The first top dielectric film 334 may be formed from a number of different materials. For example, the first top dielectric film 334 may be a dielectric material including silicon nitride ($Si_3N_4$), silicon oxynitride (SiON), tantalum oxide, or other dielectric materials. The first bottom dielectric film 332 and the first top dielectric film 334 are dissimilar.

The second bottom dielectric film 322 may be formed from a number of different materials. For example, the second bottom dielectric film 322 may be a dielectric material including silicon dioxide ($SiO_2$) or other dielectric materials. The thickness of the second bottom dielectric film 322 preferably is about in the range 50 Angstrom and 500 Angstrom, with a typical thickness of 100 Angstrom.

The second top dielectric film 320 may be formed from a number of different materials. For example, the second top dielectric film 320 may be a dielectric material including silicon nitride ($Si_3N_4$), silicon oxynitride (SiON), tantalum oxide, or other dielectric materials. The second bottom dielectric film 322 and the second top dielectric film 320 are dissimilar.

For illustrative purposes, the first bottom dielectric film 332 and the second bottom dielectric film 322 are described separately from each other, although it is understood that the first bottom dielectric film 332 and the second bottom dielectric film 322 may be formed with the same layer or layers for forming the circuit system 100. Yet further for illustrative purposes, the first top dielectric film 334 and the second top dielectric film 320 are described separately from each other, although it is understood that the first top dielectric film 334 and the second top dielectric film 320 may be formed with the same layer or layers for forming the circuit system 100.

The first resistive film 330 and the second resistive film 318 may be formed from a number of different materials. For example, the first resistive film 330 can be formed from tantalum (Ta) silicide, nickel chromium (NiCr), tantalum nitride (TaN), titanium nitride (TiN), or other high resistive metals or metal alloys.

The material of the reference plane 308 and the second lower electrode 312 can be formed from a number of conductive materials. For example, the reference plane 308 and the second lower electrode 312 may be formed from aluminum (Al), Al alloy, copper (Cu), gold (Au), or with other metals or metal alloys. For illustrative purposes, the reference plane 308 and the second lower electrode 312 are described potentially formed from substantially the same material, although it is understood that the reference plane 308 and the second lower electrode 312 may be formed with a different material or materials. Also for illustrative purposes, the reference plane 308 and the second lower electrode 312 are described potentially being formed with the same material, although it is understood that the reference plane 308 and the second lower electrode 312 may be formed with different layers for forming the circuit system 100.

Further for illustrative purposes, the first lower electrode 324 and the second lower electrode 312 are described separately from each other, although it is understood that the first lower electrode 324 and the second lower electrode 312 may be formed with the same layer or layers for forming the circuit system 100. Yet further for illustrative purposes, the first upper electrode 326 and the reference plane 308 are described separately from each other, although it is understood that the first upper electrode 326 and the reference plane 308 may be formed with the same layer or layers for forming the circuit system 100.

Figure 4:
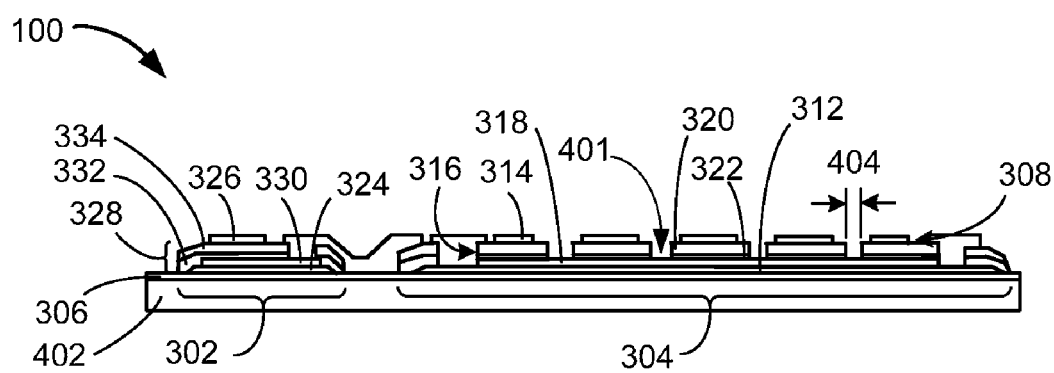
FIG. 4 is a cross-sectional view of the structure of FIG. 3 along line 4-4 of FIG. 3.

Referring now to FIG. 4, therein is shown a cross-sectional view of the structure of FIG. 3 along line 4-4 of FIG. 3. The cross-sectional view depicts the first circuit element 302 and the second circuit element 304 preferably over the insulating layer 306. The insulating layer 306 is preferably over a substrate 402. The first circuit element 302 is shown as a capacitor, as an example. The second circuit element 304 is shown connected with the reference plane 308 of which a portion is preferably over the second lower electrode, as an example.

For illustrative purposes, the substrate 402 is described as an integrated circuit substrate, although it is understood that the substrate 402 may not be an integrated circuit substrate. For example, the substrate 402 may be a substrate of an integrated circuit package and a printed circuit board.

The first circuit element 302 preferably includes the first lower electrode 324 and the first upper electrode 326 over the insulating layer 306. The insulating layer 306 is preferably formed on the substrate 402 with the first lower electrode 324 formed on the insulating layer 306. The first resistive layer 330 is patterned directly on and in direct contact with the lower electrode 324. In between the first resistive film 330 and the first upper electrode 326 is preferably the first multi-layered insulating stack 328. The first multi-layered insulating stack 328 includes preferably the first bottom dielectric film 332 deposited on the first resistive layer 330 and the first top dielectric film 334 deposited on the first bottom dielectric film 332. The first bottom dielectric film 332 of the first multi-layered insulating stack 328 is in direct contact with and covers a vertical side of the first resistive layer 330.

As described earlier, the first bottom dielectric film 332 and the first top dielectric film 334 are dissimilar. The first bottom dielectric film 332 between the first top dielectric film 334 and the first lower electrode 324 preferably reduces the stress of the first top dielectric film 334 and prevent cracking of the first top dielectric film 334.

It has been discovered that the present invention improves the reliability and the yield of the circuit system 100 with the multi-layered insulating stack of dissimilar dielectric film between the two electrodes. As an example, the silicon dioxide film under the silicon nitride film absorbs potential hillock formation from the first lower electrode preventing damage to the silicon nitride film potentially resulting in inadvertent shorting with the first upper electrode.

The second circuit element 304 preferably includes the second multi-layered insulating stacks 316 under the second upper electrode 314 and above the second resistive film 318. A top surface 401 of the second resistive film 318 is partially exposed from the second multi-layered insulating stacks 316. The second multi-layered insulating stacks 316 include the second top dielectric film 320 and the second bottom dielectric film 322 below the second top dielectric film 320. The second bottom dielectric film 322 preferably reduces the stress to the second top dielectric film 320 and prevents cracking of the second top dielectric film 320.

The second multi-layered insulating stacks 316 have gaps 404 in between. The gaps 404 provide lower stress region for directing hillock formation from the second lower electrode 312 within the gaps 404 under not under the second multi-layered insulating stacks 316 and the second upper electrode 314. The gaps 404, the second multi-layered insulating stacks 316, or the combination thereof prevents inadvertent shorting of the second lower electrode 312 and the second upper electrode 314 from hillocks from the second lower electrode 312 contacting the second upper electrode 314 though the second multi-layered insulating stacks 316.

It has been also discovered that present invention further improves the reliability and the yield of the circuit system 100 with gaps between the upper electrodes as well as with the multi-layered insulating stack of dissimilar dielectric film between the two electrodes. In addition to the introduction of first bottom dielectric film underneath the first top dielectric film 334, described earlier, a new layout having holes in the reference plane over the lower electrode also further reduce the cracking of the first top dielectric film 334 and prevent shorting between the reference plane and the lower electrode. The new layout incorporates holes in the reference plane and gaps in the first top dielectric film and first bottom dielectric film. Within these holes and gaps, the absence multi-layered stacks and the upper electrode direct any hillocks from the lower electrode to an area that will not damage the upper dielectric film or form short with the upper electrode.

For illustrative purposes, the substrate 402 is described as an integrated circuit substrate, although it is understood that the substrate 402 may not be an integrated circuit substrate. For example, the substrate 402 may be a substrate of an integrated circuit package and a printed circuit board.

Figure 5:
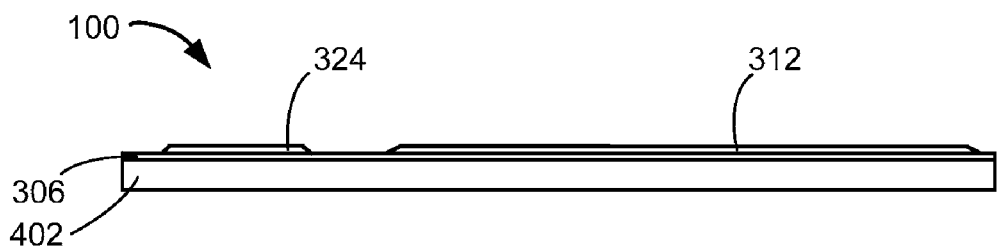
FIG. 5 is a cross-sectional view of a circuit system of FIG. 4 in a forming phase of the first lower electrode and the second lower electrode.

Referring now to FIG. 5, therein is a cross-sectional view of the circuit system 100 of FIG. 4 in a forming phase of the first lower electrode 324 and the second lower electrode 312. A first conductive film (not shown) is preferably deposited over the insulating layer 306, wherein the insulating layer 306 is preferably over the substrate 402. This first conductive film is preferably patterned, such as mask and etching, forming the first lower electrode 324 and the second lower electrode 312.

Figure 6:
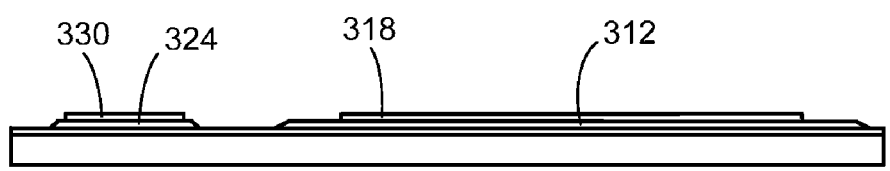
FIG. 6 is the structure of FIG. 5 in a forming phase of the first resistive film and the second resistive film.

Referring now to FIG. 6, therein is shown the structure of FIG. 5 in a forming phase of the first resistive film 330 and the second resistive film 318. A resistive material layer (not shown) is preferably deposited over the first lower electrode 324 and the second lower electrode 312. The resistive material layer is preferably patterned, such as mask and etching, forming the first resistive film 330 and the second resistive film 318.

Figure 7:
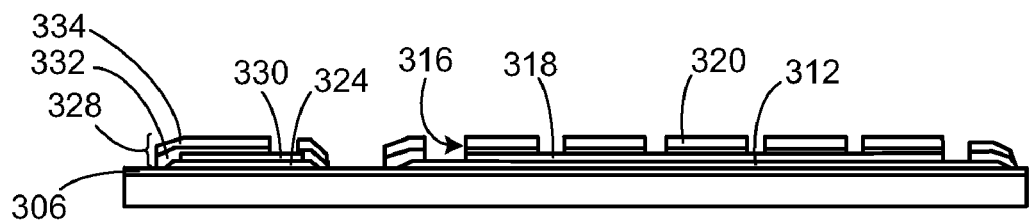
FIG. 7 is the structure of FIG. 6 in a forming phase of the first multi-layered insulating stack and the second first multi-layered insulating stacks.

Referring now to FIG. 7, therein is shown the structure of FIG. 6 in a forming phase of the first multi-layered insulating stack 328 and the second multi-layered insulating stacks 316. A first dielectric material layer (not shown) and a second dielectric material layer (not shown) are preferably deposited over the first resistive film 330, the second resistive film 318, the first lower electrode 324, the second lower electrode 312, and the insulating layer 306. The first dielectric material and the second dielectric material are preferably patterned, such as mask and etching.

A mask of patterning the first top dielectric film 334 and the second top dielectric film 320 is preferably a photo-resist mask. A mask for patterning the first bottom dielectric film 332 is preferably the same mask for patterning the first top dielectric film 334. The manufacturing process is not additional complicated since no additional lithographic steps needed to form patterns of two dielectric films.

Figure 8:
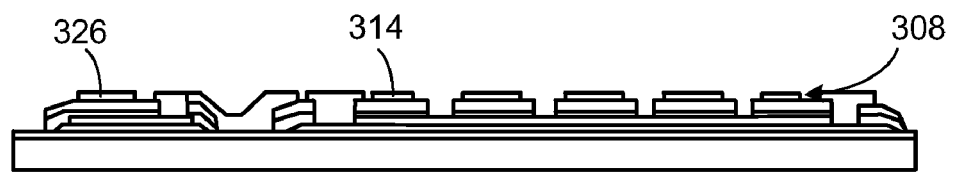
FIG. 8 is the structure of FIG. 7 in a forming phase of the first upper electrode and the reference plane.

Referring now to FIG. 8, therein is shown structure of FIG. 7 in a forming phase of the first upper electrode 326 and the reference plane 308. A second conductive film (not shown) is preferably deposited over the structure of FIG. 7. The second conductive film is preferably patterned, such as mask and etching, forms the first upper electrode 326 and the second upper electrode 314 in the reference plane 308.

Figure 9:
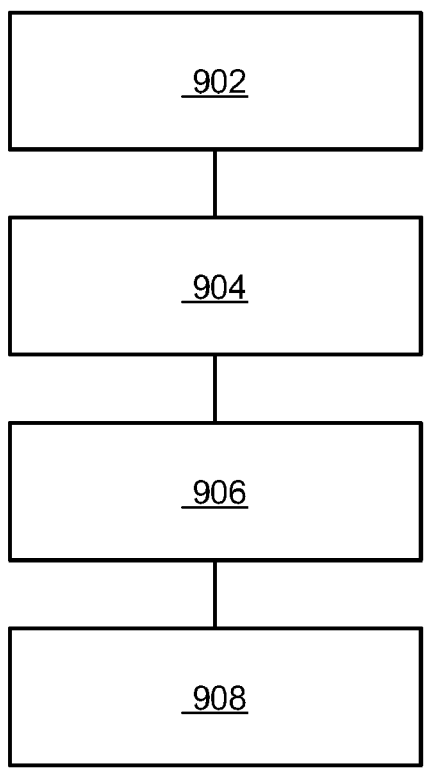
FIG. 9 is a flow chart of a circuit system for manufacturing the circuit system in an embodiment of the present invention.

Referring now to FIG. 9, therein is shown a flow chart of a circuit system 900 for manufacturing the circuit system 100 in an embodiment of the present invention. The system 900 includes forming a lower electrode over a substrate in a block 902; forming a resistive film over the lower electrode in a block 904; forming a multi-layered insulating stack over a portion of the resistive film in a block 906; and forming an upper electrode over a portion of the multi-layered insulating stack in a block 908.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the circuit system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing a circuit system comprising:
   forming a lower electrode over a substrate;
   forming a resistive film directly on the lower electrode;
   forming a multi-layered insulating stack over the resistive film with a top surface of the resistive film partially exposed from the multi-layered insulating stack, the multi-layered insulating stack in direct contact with and covering a vertical side of the resistive film; and
   depositing an upper electrode over the multi-layered insulating stack.

2. The method as claimed in claim 1 wherein forming the multi-layered insulating stack includes forming dissimilar layers of dielectric films.

3. The method as claimed in claim 1 further comprising:
   forming a further multi-layered insulating stack over the resistive film with a gap between the multi-layered insulating stack and the further multi-layered insulating stack; and
   forming the upper electrode over a portion of the further multi-layered insulating stack.

4. The method as claimed in claim 1 wherein forming the upper electrode includes forming a reference plane.

5. The method as claimed in claim 1 wherein forming the multi-layered insulating stack includes covering sides of the lower electrode.

6. A method of manufacturing a circuit system comprising:
   forming a lower electrode over a substrate;
   forming a resistive film directly on the lower electrode;
   forming multi-layered insulating stacks over the resistive film with a gap between each of the multi-layered insulating stacks with a top surface of the resistive film partially exposed from the multi-layered insulating stacks, portions of the multi-layered insulating stacks in direct contact with and covering a vertical side of the resistive film; and depositing an upper electrode over each of the multi-layered insulating stacks.

7. The method as claimed in claim 6 wherein forming the multi-layered insulating stacks includes:
   forming a bottom dielectric film comprised of oxide over the resistive film in each of the multi-layered insulating stacks; and
   forming a top dielectric film comprised of nitride over the bottom dielectric film in each of the multi-layered insulating stacks.

8. The method as claimed in claim 6 wherein forming the multi-layered insulating stacks separated by the gap includes forming a growth region for the lower electrode under the gap.

9. The method as claimed in claim 6 wherein forming the multi-layered insulating stacks separated by the gap includes not connecting the lower electrode and the upper electrode under the multi-layered insulating stacks.

10. The method as claimed in claim 6 wherein forming the lower electrode over the substrate includes forming the lower electrode over an integrated circuit substrate, an integrated circuit package substrate, or a printed circuit board.

11. A circuit system comprising:
    a substrate;
    a lower electrode over the substrate;
    a resistive film directly on the lower electrode;
    a multi-layered insulating stack over the resistive film with a top surface of the resistive film partially exposed from the multi-layered insulating stack, the multi-layered insulating stack in direct contact with and covering a vertical side of the resistive film; and
    an upper electrode over the multi-layer insulating stack.

12. The system as claimed in claim 11 wherein the multi-layered insulating stack includes dissimilar layers of dielectric films.

13. The system as claimed in claim 11 further comprising:
    a further multi-layered insulating stack over the resistive film with a gap between the multi-layered insulating stack and the further multi-layered insulating stack; and
    the upper electrode over a portion of the further multi-layered insulating stack.

14. The system as claimed in claim 11 wherein the upper electrode includes a reference plane.

15. The system as claimed in claim 11 wherein the multi-layered insulating stack is over sides of the lower electrode.

16. The system as claimed in claim 11 wherein:
    the upper electrode includes a ground plane; and
    further comprising:
       a further multi-layered insulating stack over the resistive film with a gap between the multi-layered insulating stack and the further multi-layered insulating stack; and
       the upper electrode over a portion of the further multi-layered insulating stack.

17. The system as claimed in claim 16 wherein forming the multi-layered insulating stack includes:
    a first bottom dielectric film comprised of oxide over the resistive film; and
    a first top dielectric film comprised of nitride over the first bottom dielectric film.

18. The system as claimed in claim 16 wherein the gap between the multi-layered insulating stack and the further multi-layered insulating stack includes a growth region for the lower electrode under the gap.

19. The system as claimed in claim 16 wherein the gap between the multi-layered insulating stack and the further multi-layered insulating stack includes the lower electrode and the upper electrode not connected under the multi-layered insulating stack and the further multi-layered insulating stack.

20. The system as claimed in claim 16 wherein the substrate includes an integrated circuit substrate, an integrated circuit package substrate, or a printed circuit board.

* * * * *